(12) United States Patent
Kubota et al.

(10) Patent No.: US 8,729,777 B2
(45) Date of Patent: May 20, 2014

(54) PIEZOELECTRIC OSCILLATOR

(75) Inventors: Hajime Kubota, Kawasaki (JP);
Masayuki Itoh, Kawasaki (JP);
Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 259 days.

(21) Appl. No.: 12/973,194

(22) Filed: Dec. 20, 2010

(65) Prior Publication Data

US 2011/0169377 A1    Jul. 14, 2011

(30) Foreign Application Priority Data

Jan. 8, 2010   (JP) ................................ 2010-003279

(51) Int. Cl.
*H03H 9/05*    (2006.01)
(52) U.S. Cl.
USPC .......................................... 310/348; 310/368
(58) Field of Classification Search
USPC .......................................... 310/348, 365, 366
See application file for complete search history.

(56) References Cited

U.S. PATENT DOCUMENTS

| | | | |
|---|---|---|---|
| 2005/0184625 A1* | 8/2005 | Miyazaki | 310/348 |
| 2008/0309202 A1* | 12/2008 | Dalla Piazza et al. | 310/348 |
| 2011/0291529 A1* | 12/2011 | Numata | 310/348 |

FOREIGN PATENT DOCUMENTS

| | | |
|---|---|---|
| JP | 2137511 A | 5/1990 |
| JP | 08-316771 | 11/1996 |
| JP | 2002124845 A | 4/2002 |
| JP | 2004088524 A | 3/2004 |
| JP | 2004-222006 | 8/2004 |
| JP | 2005198237 A | 7/2005 |
| JP | 2007096945 A | 4/2007 |
| JP | 2007-288644 | 11/2007 |
| JP | 2010226418 A | 10/2010 |

OTHER PUBLICATIONS

Japanese Office Action application No. 2010-003279 dated Feb. 14, 2012.
Japanese Office Action application No. 2010-003279 dated Nov. 8, 2011.

* cited by examiner

*Primary Examiner* — Derek Rosenau
(74) *Attorney, Agent, or Firm* — Squire Sanders (US) LLP

(57) ABSTRACT

A piezoelectric crystal unit includes a package including a concave portion; a piezoelectric element having a protruding electrode and disposed within the package; and an electrically conductive adhesive contained in the concave portion. The piezoelectric element is fixed to the package with the protruding electrode embedded in the concave portion of the package.

7 Claims, 14 Drawing Sheets

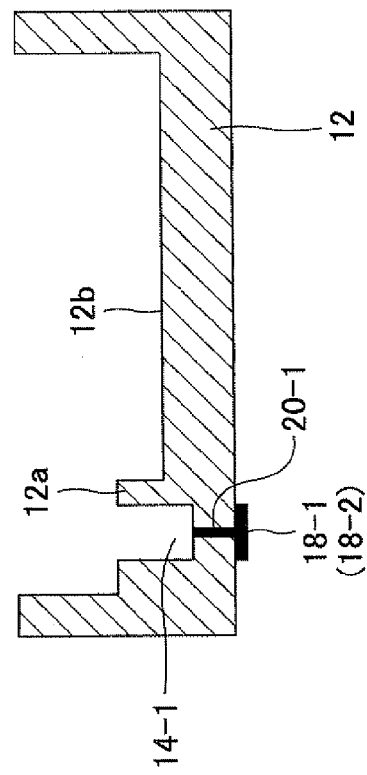
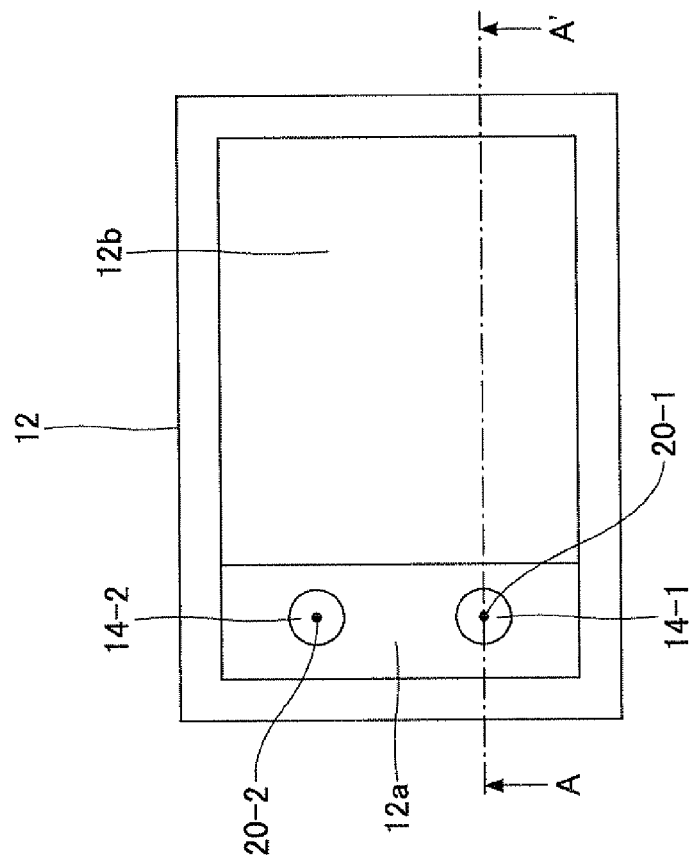
FIG.2B
FIG.2A

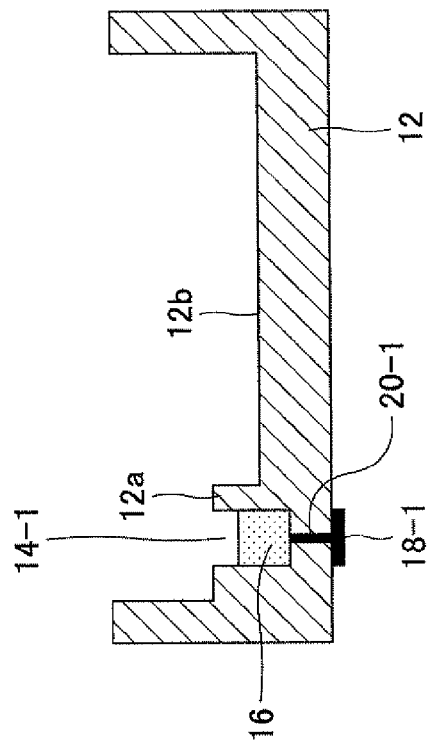
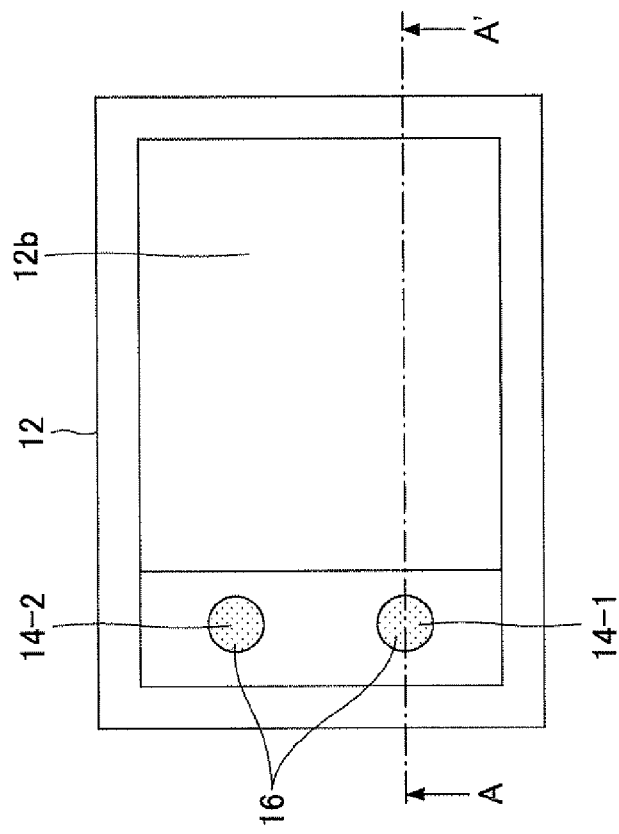
FIG.3B
FIG.3A

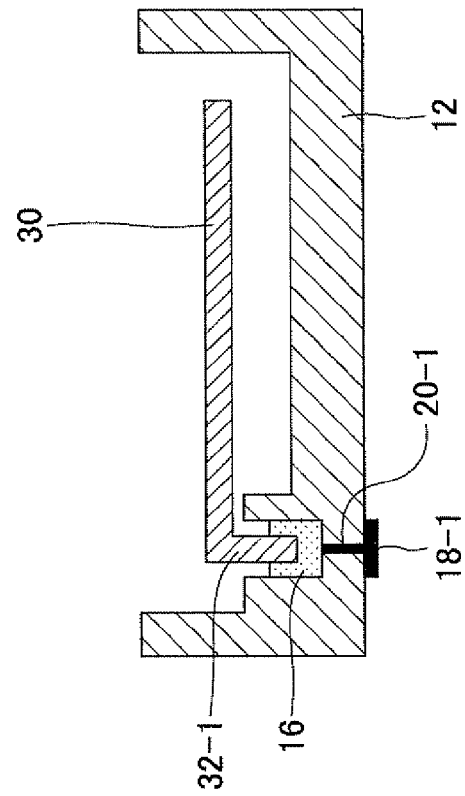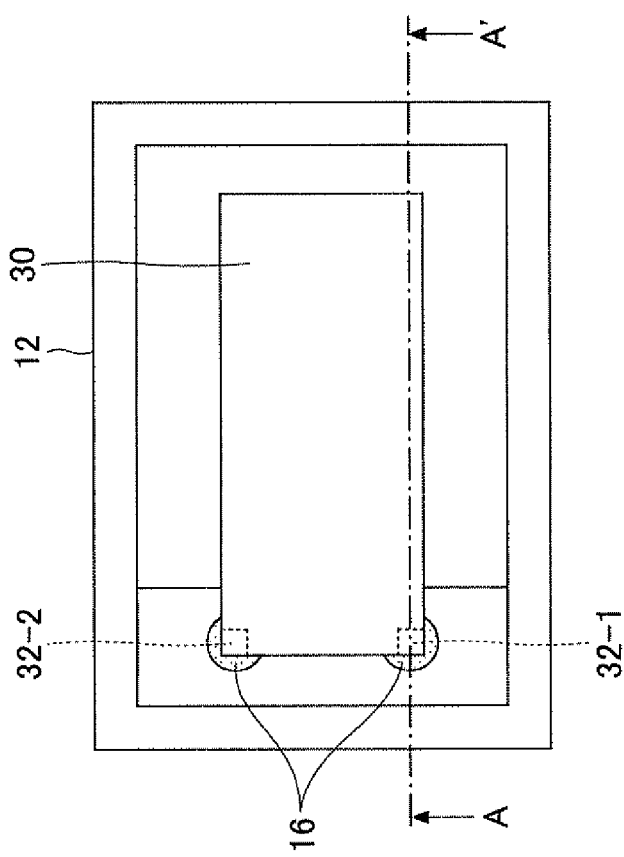

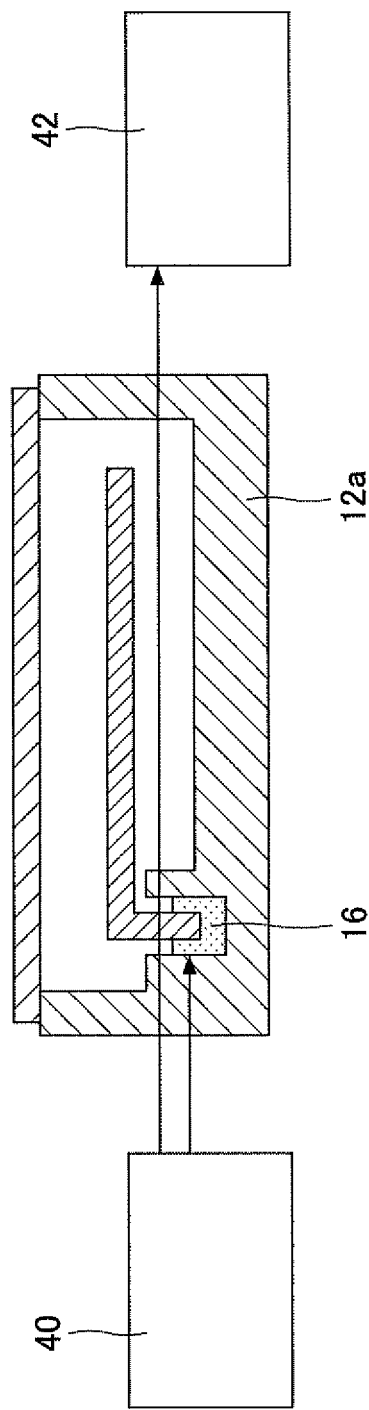

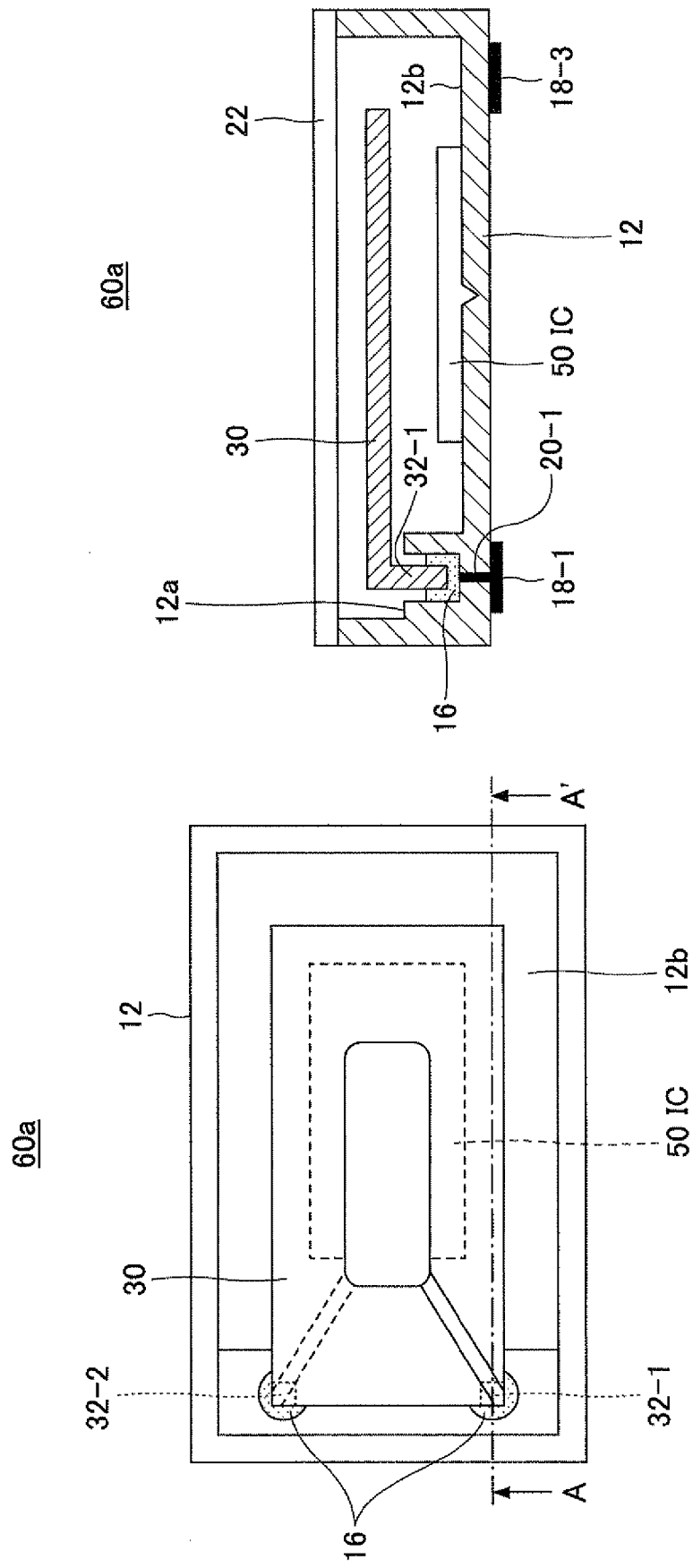

PIEZOELECTRIC OSCILLATOR

CROSS-REFERENCE TO RELATED APPLICATIONS

This application is based upon and claims the benefit of priority of Japanese Patent Application 2010-003279, filed on Jan. 8, 2010, the entire contents of which are incorporated herein by reference.

FIELD

Embodiments discussed herein are related to a piezoelectric oscillator.

BACKGROUND

Generally, a crystal unit, such as a piezoelectric crystal unit, is provided in a package containing a piezoelectric element. Typically, external electrodes disposed on an outer surface of the package are electrically connected to internal electrodes of the package. The internal electrodes are connected to electrodes of the piezoelectric element housed within the package.

The piezoelectric element typically has two electrodes, which may be connected to two internal electrodes of the package by using an electrically conductive adhesive. In one method of connecting the electrodes using electrically conductive adhesive, an amount of the electrically conductive adhesive is applied to the two internal electrodes of the package using a dispenser, and then the two electrodes of the piezoelectric element are placed on the two internal electrodes of the package via the electrically conductive adhesive. The electrically conductive adhesive is thereafter cured. Thus, the piezoelectric element is housed within the package with the electrically conductive adhesive disposed between the two piezoelectric element electrodes and the two internal electrodes of the package.

In this case, the electrically conductive adhesive between the electrodes may flow out and come into contact with another portion of the package, resulting in a short-circuit or changing the oscillating frequency of the crystal unit. A conventional technology aims to overcome the above problem by providing a concave portion in the package for containing the electrically conductive adhesive, while a through-hole is formed in the bottom of the concave portion. The technology allows excess electrically conductive adhesive to flow out of the concave portion via the through-hole (see JP-A-8-316771, for example).

It has also been proposed to provide a concave portion or a through-hole between a portion that is bonded by the electrically conductive adhesive and a portion that is not bonded, so that excess electrically conductive adhesive can be collected by the concave portion or via the through-hole (see JP-A-2007-288644, for example).

Another proposed solution involves increasing the thickness of a front-end part of an electrically conductive adhesive portion compared to the thickness of an intermediate- or rear-part of the adhesive portion when connecting the lead electrodes of a piezoelectric element to the internal electrodes of the package via the electrically conductive adhesive portion (see JP-A-2004-222006, for example). The internal electrodes of the package may be coated with the electrically conductive adhesive by dropping a liquid electrically conductive adhesive onto the internal electrodes from a nozzle of a dispenser. In this case, the amount of the electrically conductive adhesive dropped and the dropped position may vary between the two internal electrodes. FIG. 1 is a plan view of the inside of a package 2 having two internal electrodes 4-1 and 4-2 on which drops of an electrically conductive adhesive 6 have been dropped from a dispenser. It is seen that, due to variations in the dropped amount and position of the electrically conductive adhesive, the size and position of the drops of the electrically conductive adhesive 6 are different between the internal electrodes 4-1 and 4-2.

As illustrated in FIG. 1, when the position or amount of the drops of the electrically conductive adhesive 6 is different between the internal electrodes 4-1 and 4-2, the oscillating frequency of the piezoelectric element may be destabilized, or the piezoelectric element may fail to oscillate. For example, as the electrically conductive adhesive 6 cures, the stress distribution of the piezoelectric element may become uneven, resulting in a change in its oscillating frequency characteristics. The stress distribution of the piezoelectric element may also be changed by the aging of the electrically conductive adhesive 6, resulting in a change in the oscillating frequency characteristics.

SUMMARY

According to an embodiment of the invention, a piezoelectric crystal unit includes a package, a piezoelectric element, and an electrically conductive adhesive. The package includes a concave portion. The piezoelectric element has a protruding electrode and is disposed within the package. The electrically conductive adhesive is contained in the concave portion. The piezoelectric element is fixed to the package with the protruding electrode embedded in the concave portion of the package.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B illustrate a step of a process of manufacturing a piezoelectric crystal unit according to an embodiment of the present invention;

FIGS. 3A and 3B illustrate another step of the process of manufacturing the piezoelectric crystal unit;

FIGS. 4A and 4B illustrate another step of the process of manufacturing the piezoelectric crystal unit;

FIG. 10 illustrates a method of controlling the amount of the electrically conductive adhesive in a concave portion using laser;

FIGS. 11A and 11B illustrate a crystal oscillator including an IC according to another embodiment of the present invention;

DESCRIPTION OF EMBODIMENTS

Figure 1:
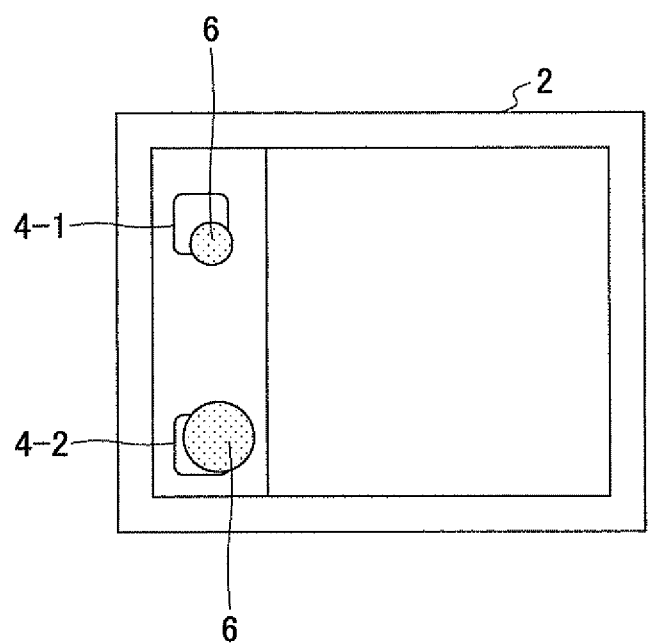
FIG. 1 is a plan view of the inside of an oscillator package, illustrating two internal electrodes of the package covered with drops of an electrically conductive adhesive supplied dropwise from a dispenser.

Hereinafter, a process of manufacturing a piezoelectric crystal unit according to the embodiments of the present invention will be described with reference to the attached drawings.

Referring now to the drawings, wherein like reference numerals designate identical or corresponding parts throughout the several views, a process of manufacturing a piezoelectric crystal unit 60 (see FIGS. 6A and 6B) according to an embodiment of the present invention is described with reference to FIGS. 2A through 6B. FIGS. 2A, 3A, 4A, 5A, and 6A are plan views, and FIGS. 2B, 3B, 4B, 5B, and 6B are cross sections taken along lines A-A' of the corresponding plan views.

First, there is prepared a ceramic package 12 having concave portions 14-1 and 14-2 formed in a mount portion 12a, as illustrated in FIGS. 2A and 2B. The mount portion 12a is raised from a bottom surface 12b of the ceramic package 12, as illustrated in FIG. 2B. External electrodes 18-1 and 18-2 are disposed on a lower outer surface of the ceramic package 12. Through-holes 20-1 and 20-2 are provided between bottoms of the concave portions 14-1 and 14-2, respectively, and the lower outer surface of the ceramic package 12.

Then, as illustrated in FIGS. 3A and 3B, an electrically conductive adhesive 16 is poured into the concave portions 14-1 and 14-2 of the ceramic package 12. The electrically conductive adhesive 16 may be poured dropwise into the concave portions 14-1 and 14-2 using a dispenser, as is well known in the art.

Thereafter, a crystal oscillating element 30 is disposed within the ceramic package 12, as illustrated in FIGS. 4A and 4B. The crystal oscillating element 30 has protruding electrode portions 32-1 and 32-2 which may be formed at the corners on one side of the crystal oscillating element 30, as illustrated in FIG. 4A. The crystal oscillating element 30 is disposed within the ceramic package 12 by embedding the protruding electrode portions 32-1 and 32-2 in the concave portions 14-1 and 14-2, respectively, filled with the electrically conductive adhesive 16. Thus, the protruding electrode portions 32-1 and 32-2 of the crystal oscillating element 30 are electrically connected to the external electrodes 18-1 and 18-2 via the electrically conductive adhesive 16 and the through-holes 20-1 and 20-2.

Thus, the crystal oscillating element 30 is disposed in the ceramic package 12 with one end of the crystal oscillating element 30 attached to the mount portion 12a in a "cantilever fashion", such that there is a space between the crystal oscillating element 30 and the bottom surface 12b, as illustrated in FIG. 4B.

Figure 5B:
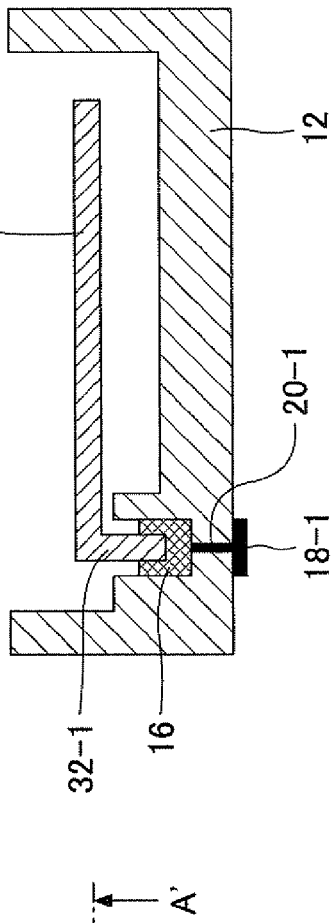
FIGS. 5A and 5B illustrate another step of the process of manufacturing the piezoelectric crystal unit.
Figure 5A:
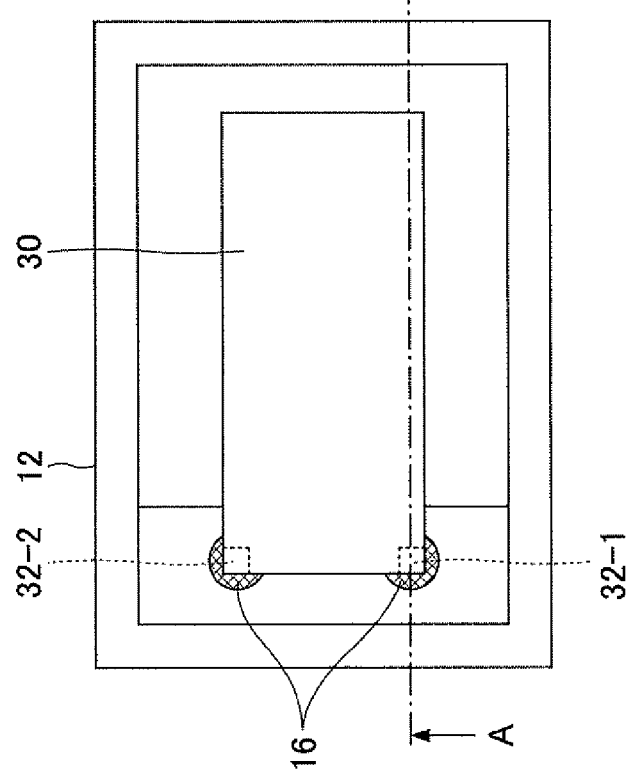
Figure 6B:
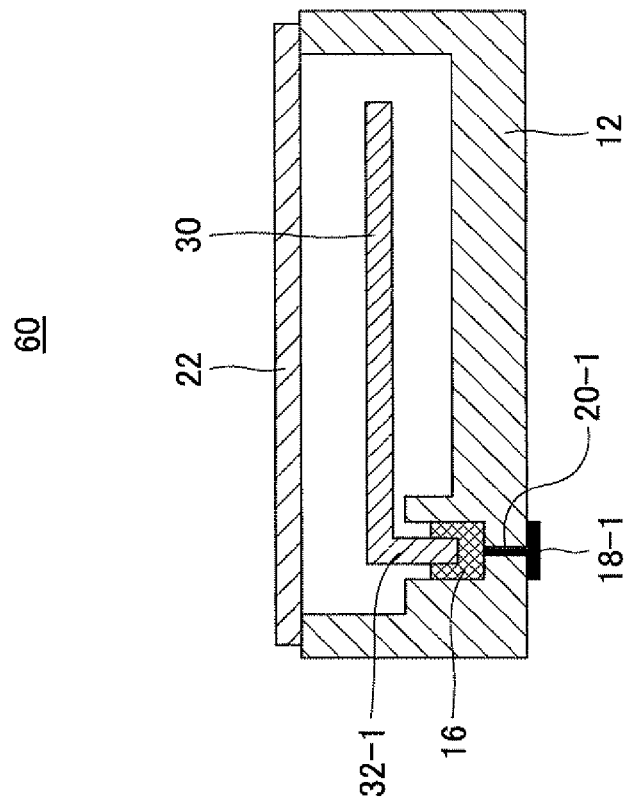
FIGS. 6A and 6B illustrate another step of the process of manufacturing the piezoelectric crystal unit.
Figure 6A:
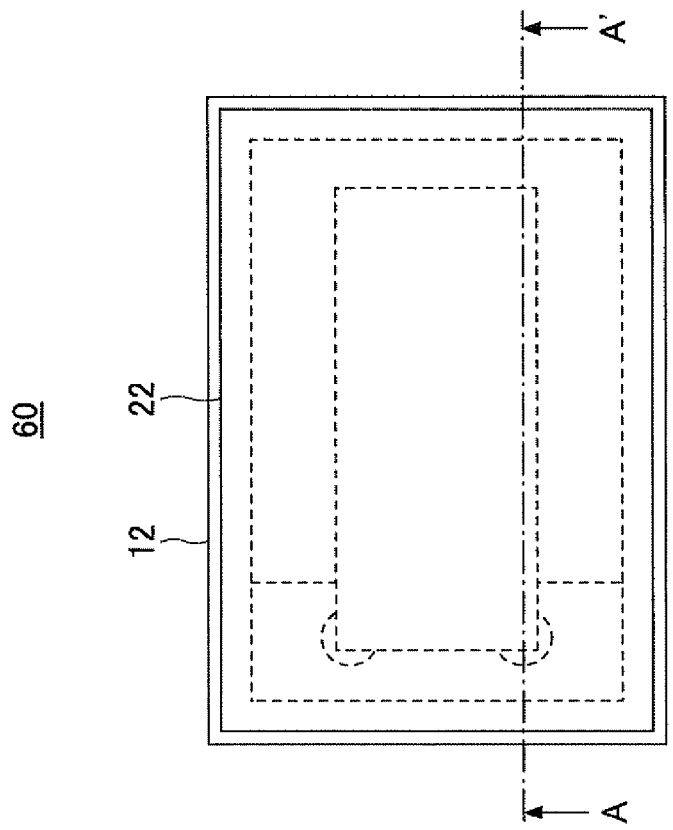

Thereafter, the electrically conductive adhesive 16 is heated and cured, thereby fixing the crystal oscillating element 30 to the ceramic package 12, as illustrated in FIGS. 5A and 5B. A lid 22 is then attached to the ceramic package 12 as illustrated in FIGS. 6A and 6B, thus completing the piezoelectric crystal unit 60 according to the present embodiment.

Figure 7:
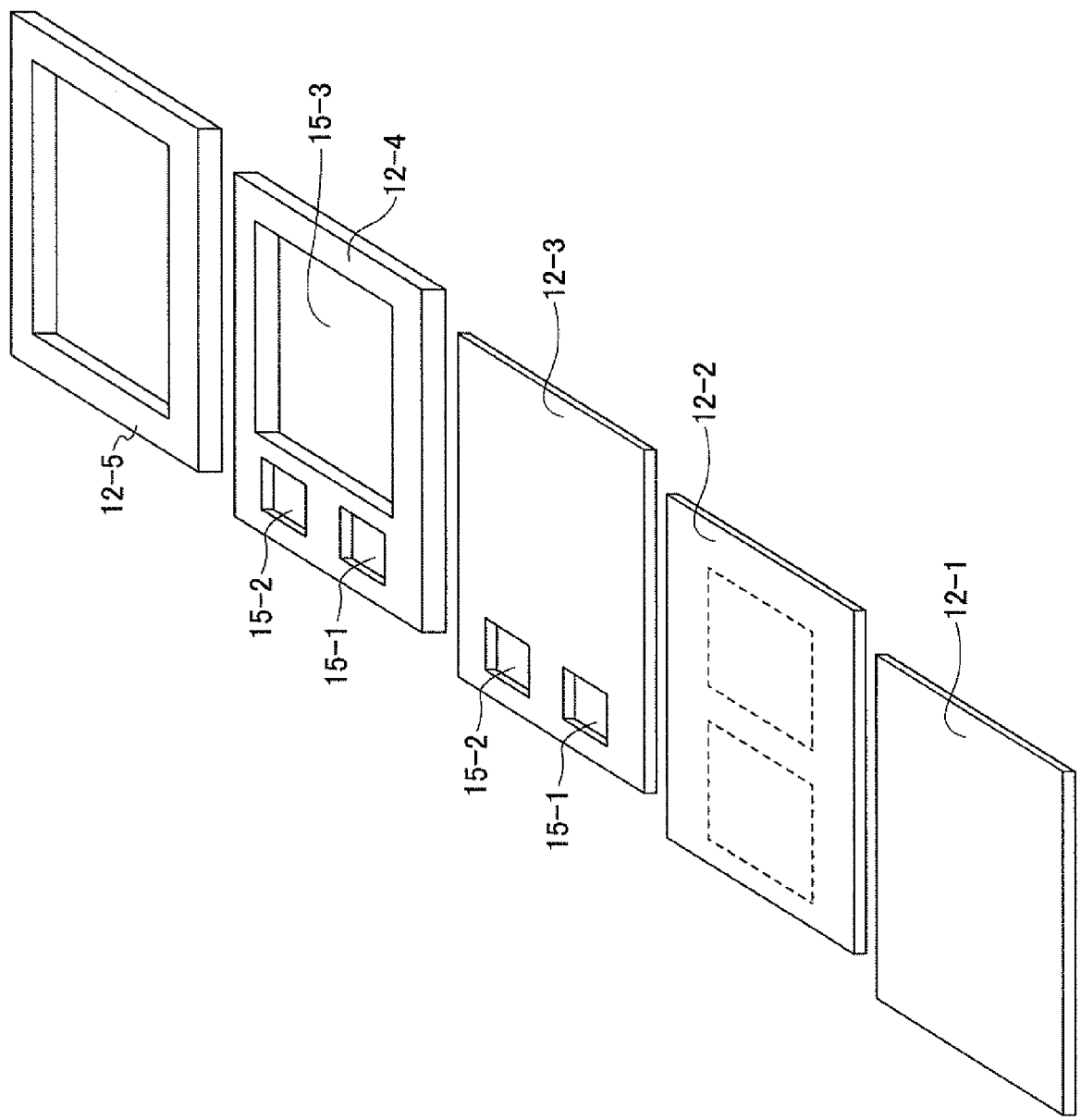
FIG. 7 is a perspective view of components of the ceramic package according to the present embodiment.

A process of manufacturing the ceramic package 12 is described with reference to FIG. 7. In this process, the ceramic package 12 is formed by laminating ceramic sheets of predetermined shapes and then firing the resultant laminate. Specifically, a wiring-layer ceramic sheet 12-2 is laminated on a bottom ceramic sheet 12-1. On the wiring-layer ceramic sheet 12-2, there is laminated a third ceramic sheet 12-3 in which openings 15-1 and 15-2 corresponding to the shapes of the concave portions 14-1 and 14-2 are formed in an area corresponding to the mount portion 12a. While the openings 15-1 and 15-2 are rectangular in the illustrated example, the openings 15-1 and 15-2 may be formed in circular shapes when the concave portions 14-1 and 14-2 are circular, as illustrated in FIGS. 2A through 6B.

On the third ceramic sheet 12-3, there is laminated a fourth ceramic sheet 12-4. The fourth ceramic sheet 12-4 also has openings 15-1 and 15-2 corresponding to the shapes of the concave portions 14-1 and 14-2 in an area where the mount portion 12a is to be formed. Further, the fourth ceramic sheet 12-4 has another opening 15-3 in an area separate from the mount portion 12a. Finally, a fifth ceramic sheet 12-5 defining an outer perimeter of the ceramic package 12 is laminated on the ceramic sheet 12-4. The obtained laminate of the ceramic sheets is then fired, obtaining the ceramic package 12 having the concave portions 14-1 and 14-2.

The ceramic sheets 12-1 through 12-5 may be formed of a transparent material, as will be described later, so that the amount of the electrically conductive adhesive 16 in the concave portions 14-1 and 14-2 can be monitored from outside the ceramic package 12.

Figure 8A:
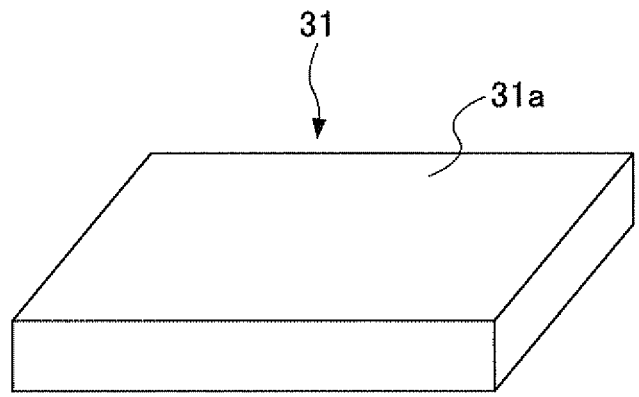
FIG. 8A is a perspective view of a crystal plate illustrating a step of a process of manufacturing a crystal oscillating element.
Figure 8B:
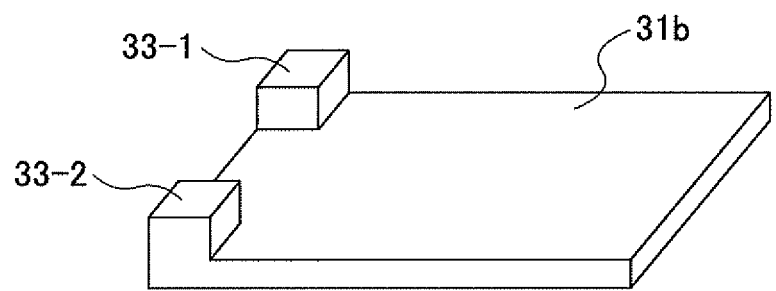
FIG. 8B is a perspective view of the crystal plate that has been ground, illustrating another step of the process of manufacturing the crystal oscillating element.
Figure 8C:
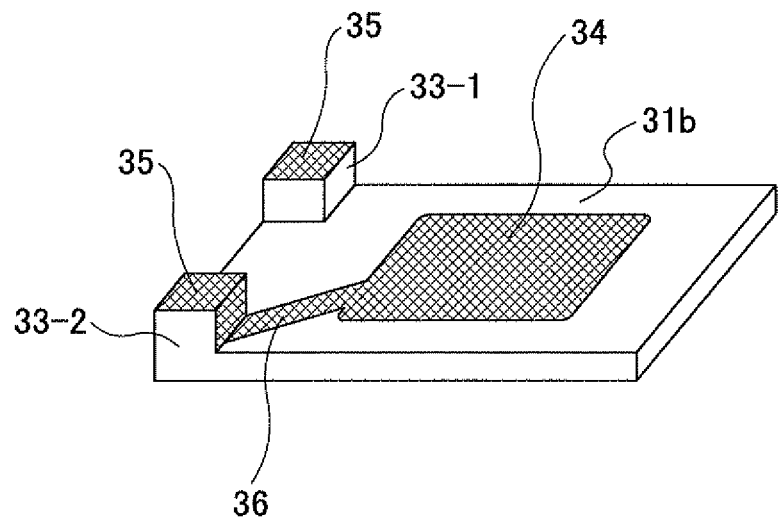
FIG. 8C is a perspective view of the crystal plate on which electrodes are formed, illustrating another step of the process of manufacturing the crystal oscillating element.

Next, a process of manufacturing the crystal oscillating element 30 having the protruding electrode portions 32-1 and 32-2 is described with reference to FIGS. 8A through 8C. First, a crystal plate 31 is prepared, as illustrated in FIG. 8A. One surface 31a of the crystal plate 31 is ground to form a ground surface 31b, leaving protrusions 33-1 and 33-2 corresponding to the protruding electrode portions 32-1 and 32-2, respectively, as illustrated in FIG. 8B. Thereafter, an electrode 34 is formed on the ground surface 31b by metal vapor deposition, as illustrated in FIG. 8C. While not illustrated, a similar electrode is also formed on a back surface opposite the ground surface 31b of the crystal plate 31.

Another electrode 35 is formed on an upper surface of the protrusions 33-1 and 33-2 by metal vapor deposition. Further, a conductive pattern 36 connecting the electrode 35 on the protrusion 33-2 and the electrode 34 on the ground surface 31b is formed by metal vapor deposition. While not illustrated in FIG. 8C, there is also formed a conductive pattern connecting the electrode on the back surface of the ground surface 31b and the electrode 35 on the protrusion 33-1 by metal vapor deposition. The protrusion 33-1 and the electrode 35 on its top form the protruding electrode 32-1, while the protrusion 33-2 and the electrode 35 on its top form the protruding electrode 32-2.

Because the electrically conductive adhesive 16 is to be contained in the concave portions 14-1 and 14-2, the position and planar area of the electrically conductive adhesive 16 are determined by the position and size of the concave portions 14-1 and 14-2. Thus, the electrically conductive adhesive 16 can be provided at a constant position and within a constant area. The size (including depth) of the concave portions 14-1 and 14-2 is adjusted such that the electrically conductive adhesive 16 does not flow out of the concave portions 14-1 and 14-2. In this way, the problem of short-circuit and the like can be prevented.

Figure 9:
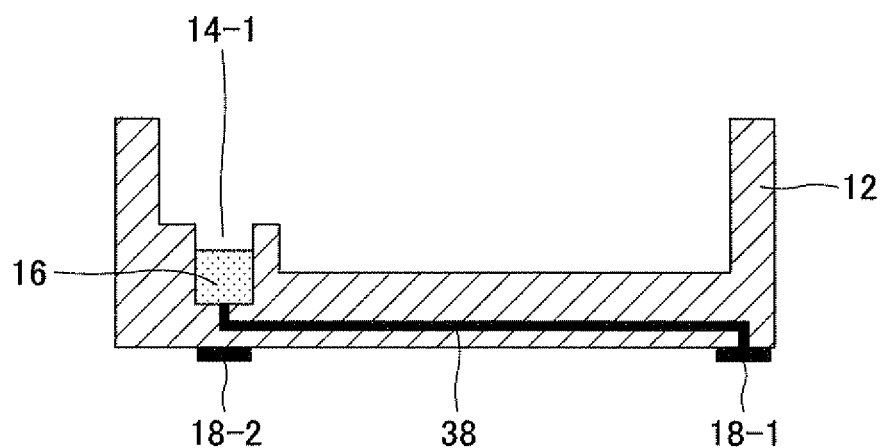
FIG. 9 is a cross section of the ceramic package having an internal wiring.

The location of the external electrodes 18-1 and 18-2 may be adjusted by providing wiring within the ceramic package 12. FIG. 9 is a cross section of the ceramic package 12 in which the external electrode 18-1 is formed at a distance from the external electrode 18-2 in a longitudinal direction using a wire 38, which may be formed in a bottom wall of the ceramic package 12 as illustrated in FIG. 9. The wiring within the ceramic package 12 may be formed on the wiring-layer ceramic sheet 12-2 illustrated in FIG. 7.

A method of controlling the amount of the electrically conductive adhesive 16 in the concave portions 14-1 and 14-2 is described with reference to FIG. 10. By forming the ceramic sheets 12-1 through 12-5 illustrated in FIG. 7 of a transparent material, a transparent ceramic package 12a can be formed. The transparent ceramic package 12a allows for a visual inspection of the amount of the electrically conductive adhesive 16 in the concave portions 14-1 and 14-2. Alternatively, a laser may be used for the inspection, so that the amount of the electrically conductive adhesive 16 can be controlled more accurately, as described below.

In the example of FIG. 10, the level of the electrically conductive adhesive 16 in the concave portion 14-1 is detected by irradiating the concave portion 14-1 with two beams of laser light from a laser irradiating unit 40 on one side. A laser beam of light that has passed through the ceramic package 12a is received and detected on the other side by a laser receiving unit 42. Of the two laser beams of light illustrated in FIG. 10, the lower laser beam is set to a height corresponding to the level of a minimum required amount of the electrically conductive adhesive 16 in the concave portion 14-1. The other, upper laser beam is set to a height corresponding to the level of a maximum permissible amount of the electrically conductive adhesive 16 in the concave portion 14-1.

If the lower laser beam of light is blocked by the electrically conductive adhesive 16 and only the upper laser beam of light is detected by the laser receiving unit 42, the level of the electrically conductive adhesive 16 is higher than a lower limit and lower than an upper limit. Thus, there is an appropriate amount of the electrically conductive adhesive 16. If both the upper and the lower laser beams of light are detected by the laser receiving unit 42, the level of the electrically conductive adhesive 16 is lower than the lower limit, indicating that the amount of the electrically conductive adhesive 16 is less than required. If neither the lower laser beam of light nor the upper laser beam of light is detected, the level of the electrically conductive adhesive 16 is higher than the upper limit, indicating that the amount of the electrically conductive adhesive 16 is excessive. Thus, by irradiating the transparent ceramic package 12, specifically the concave portion 14-1, with beams of laser light, the amount of the electrically conductive adhesive 16 in the concave portion 14-1 can be accurately controlled. The amount of the electrically conductive adhesive 16 may be determined by other methods.

Next, a crystal oscillator 60a according to another embodiment of the present invention is described. FIG. 11A is a plan view of the inside of the ceramic package 12 of the crystal oscillator 60a. FIG. 11B is a cross section taken along line A-A' of FIG. 11A. Parts or components similar to those illustrated in FIG. 6 are designated with similar numerals and their description is omitted. The crystal oscillator 60a differs from the crystal unit 60 of the foregoing embodiment in that an IC 50 including an oscillating circuit is contained in the ceramic package 12. The IC 50 may be mounted on the bottom surface 12b of the ceramic package 12 under the crystal oscillating element 30, as illustrated in FIG. 11B.

Figure 12B:
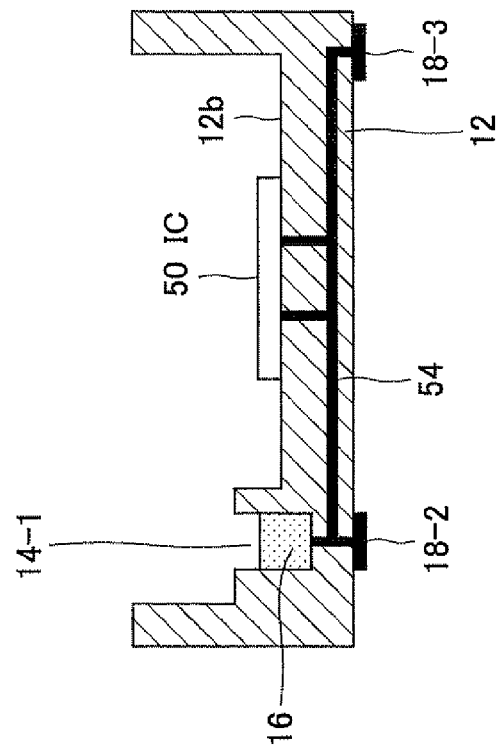
FIGS. 12A and 12B illustrate the crystal oscillator including the IC according to another embodiment of the present invention.
Figure 12A:
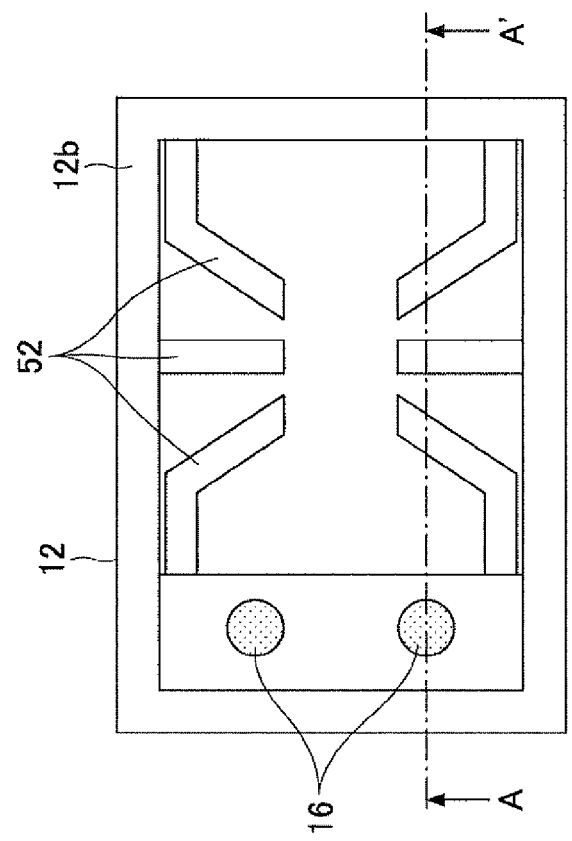

FIG. 12A is a plan view of the ceramic package 12 of the crystal oscillator 60a according to another embodiment of the present invention. FIG. 12B is a cross section taken along line A-A' of FIG. 12A. On the bottom surface 12b of the ceramic package 12, there is formed wiring 52 connected to electrodes of the IC 50. The wiring 52 is also connected to the external connection terminals 18-2 and 18-3 via wiring 54 which may be formed within a bottom wall of the ceramic package 12. The electrodes of the IC 50 are electrically connected to the electrically conductive adhesive 16 via the wiring 54.

Figure 13B:
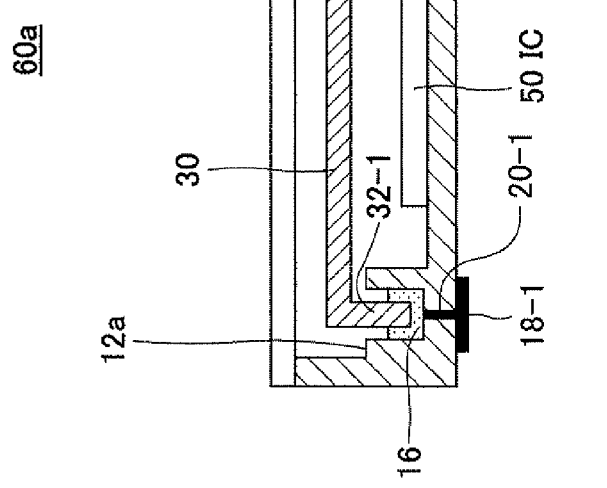
FIGS. 13A and 13B illustrate a variation of the crystal oscillator of FIGS. 11A and 11B.
Figure 13A:
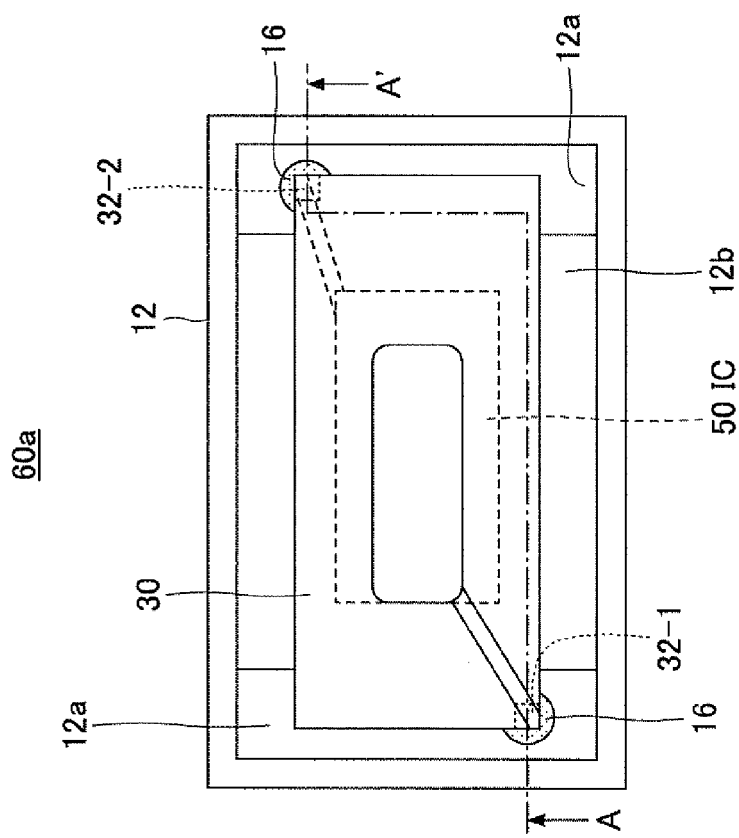

FIG. 13A is a plan view of the ceramic package 12 of the crystal oscillator 60a according to a variation of the embodiment of FIG. 11. FIG. 13B is a cross section taken along line A-A' of FIG. 13A. In accordance with this variation, in contrast to the "cantilever" structure illustrated in FIG. 11, for example, the protruding electrode portions 32-1 and 32-2 are formed on opposite sides of the crystal oscillating element 30, as illustrated in FIG. 13A. The ceramic package 12 also includes two of the mount portions 12a one on either side. Thus, the crystal oscillating element 30 is mounted on the ceramic package 12 via the mount portions 12a one on either side, as may be better seen in FIG. 13B. Such a "both-sides" supporting structure of FIGS. 13A and 13B may be applied to the crystal unit of the embodiment illustrated in FIG. 6, for example.

Figure 14:
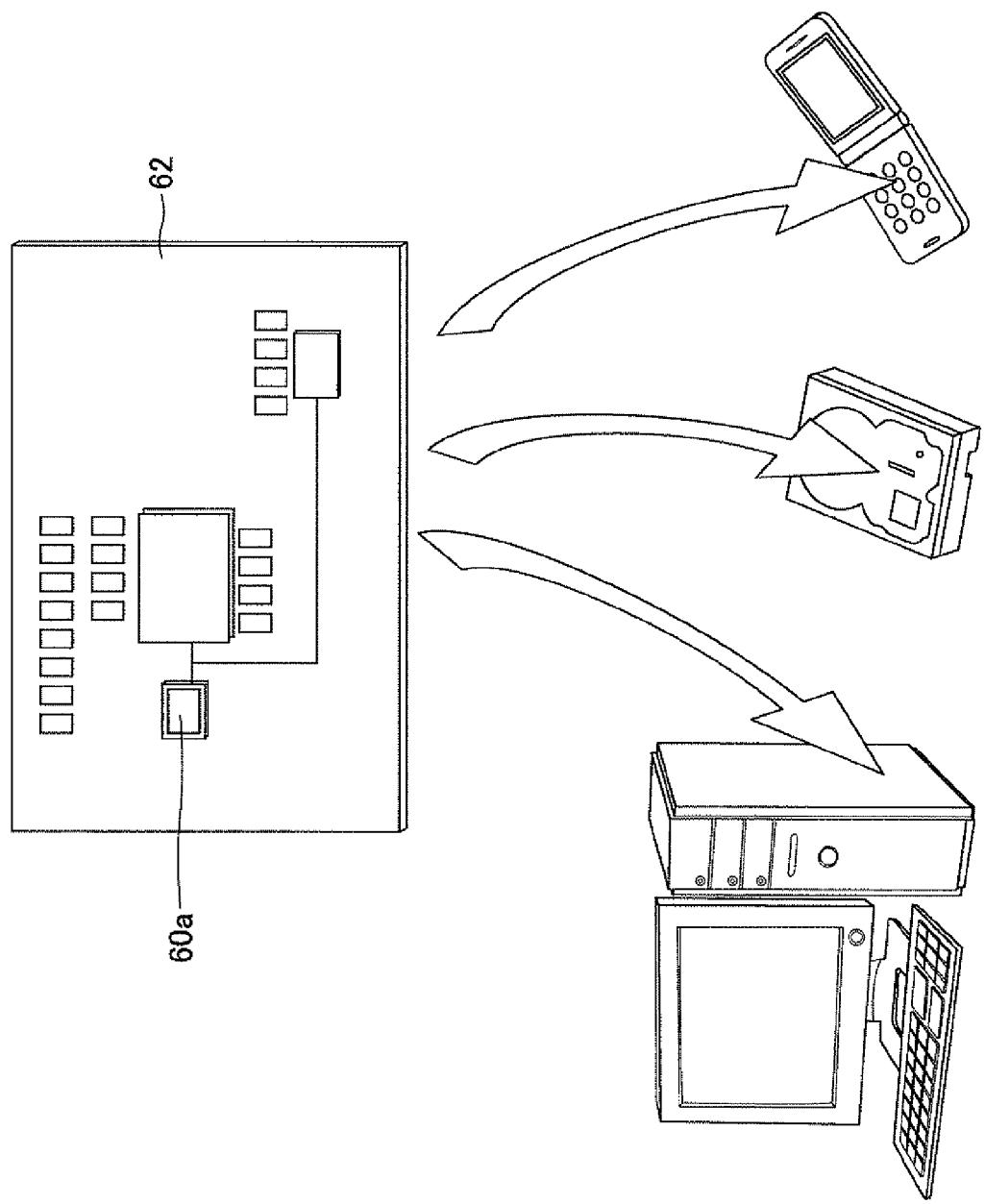
FIG. 14 illustrates various applications of the crystal oscillator according to an embodiment of the present invention.

FIG. 14 illustrates a printed circuit board 62 on which the crystal oscillator 60a according to the foregoing embodiment is mounted as one of the components of an electronic circuit which may be used in a personal computer, hard disk unit, cellular phone, and so on.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that the various changes, substitutions, and alterations could be made hereto without departing from the spirit and scope of the invention.

The invention claimed is:

1. A piezoelectric crystal unit comprising:
a piezoelectric element having a protruding electrode;
a package defining an inner space to accommodate the piezoelectric element;
a concave portion formed on an inner surface of the package; and
an electrically conductive adhesive filling the concave portion,
wherein the piezoelectric element comprises an L-shape, the protruding electrode corresponds to an end portion of the L-shape, and the piezoelectric element is fixed to the package with the end portion of the L-shape embedded in the electrically conductive adhesive in the concave portion of the package, and
wherein the protruding electrode of the piezoelectric element protrudes in a direction perpendicular to a body of the piezoelectric element.

2. The piezoelectric crystal unit according to claim 1, further comprising an external connection terminal disposed on an outer surface of the package,
  wherein the external connection terminal is electrically connected to the electrically conductive adhesive in the concave portion of the package via a through-hole provided between an inner surface of the concave portion and the outer surface of the package.

3. The piezoelectric crystal unit according to claim 1, wherein the piezoelectric element has two of the protruding electrodes,
  wherein the two protruding electrodes are disposed on one side of the piezoelectric element, and
  the piezoelectric element is fixed to the package in a cantilever fashion via the one side of the piezoelectric element.

4. The piezoelectric crystal unit according to claim 1, wherein the piezoelectric element has two of the protruding electrodes,
  wherein one of the two protruding electrodes is disposed on one side of the piezoelectric element while the other of the protruding electrodes is disposed on an opposite side of the piezoelectric element, and
  the piezoelectric element is fixed to the package in a both-sides supporting fashion via the both ends of the piezoelectric element.

5. The piezoelectric crystal unit according to claim 1, wherein the package is made of a transparent material.

6. A piezoelectric oscillator, comprising:
  the piezoelectric crystal unit according to claim 1; and
  an integrated circuit disposed in the package.

7. A method of manufacturing a piezoelectric crystal unit comprising:
  preparing a package including a concave portion from a transparent material;
  disposing a piezoelectric element having a protruding electrode within the package,
  wherein the piezoelectric element comprises an L-shape, and the protruding electrode corresponds to an end portion of the L-shape;
  filling the concave portion with an electrically conductive adhesive;
  fixing the piezoelectric element to the package by embedding the end portion of the L-shape in the electrically conductive adhesive in the concave portion of the package;
  irradiating the concave portion with a laser beam of light via one side of the package;
  detecting the laser beam of light that has passed through the package on an opposite side of the package; and
  determining an amount of the electrically conductive adhesive in the concave portion based on a result of detection of the laser beam of light.

* * * * *